US012176461B2

(12) United States Patent
Chen et al.

(10) Patent No.: US 12,176,461 B2
(45) Date of Patent: Dec. 24, 2024

(54) METHOD OF FABRICATING AN INTEGRATED STRUCTURE FOR AN OPTOELECTRONIC DEVICE AND INTEGRATED STRUCTURE FOR AN OPTOELECTRONIC DEVICE

(71) Applicant: MASSACHUSETTS INSTITUTE OF TECHNOLOGY, Cambridge, MA (US)

(72) Inventors: Yijing Chen, Singapore (SG); Li Zhang, Singapore (SG); Kenneth Eng Kian Lee, Singapore (SG); Eugene A. Fitzgerald, Singapore (SG)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 378 days.

(21) Appl. No.: 17/621,104

(22) PCT Filed: Jun. 24, 2020

(86) PCT No.: PCT/SG2020/050352
§ 371 (c)(1),
(2) Date: Dec. 20, 2021

(87) PCT Pub. No.: WO2020/263181
PCT Pub. Date: Dec. 30, 2020

(65) Prior Publication Data
US 2022/0352423 A1    Nov. 3, 2022

(30) Foreign Application Priority Data
Jun. 28, 2019   (SG) .............................. 10201906069T

(51) Int. Cl.
*H01L 33/38* (2010.01)
*H01L 25/075* (2006.01)
(Continued)

(52) U.S. Cl.
CPC ........ *H01L 33/382* (2013.01); *H01L 25/0753* (2013.01); *H01L 33/0093* (2020.05);
(Continued)

(58) Field of Classification Search
CPC .............................. H01L 27/15; H01L 27/156
See application file for complete search history.

(56) References Cited

U.S. PATENT DOCUMENTS

| 5,541,443 | A | * | 7/1996 | Lee | ......................... | H03K 19/14 |
| | | | | | | 250/214 LS |
| 2011/0299044 | A1 | * | 12/2011 | Yeh | ......................... | H04N 9/315 |
| | | | | | | 353/52 |

(Continued)

FOREIGN PATENT DOCUMENTS

| CN | 103066192 A | 4/2013 |
| JP | 2011146575 A | 7/2011 |

(Continued)

OTHER PUBLICATIONS

Office Action issued in corresponding Japanese Patent Application No. 2021-574900.

(Continued)

*Primary Examiner* — Evren Seven
(74) *Attorney, Agent, or Firm* — Volpe Koenig

(57) ABSTRACT

An integrated structure for an optoelectronic device and a method of fabricating an integrated structure for an optoelectronic device. The method comprises the steps of forming a plurality of epitaxial layers for optical elements on an epitaxial growth substrate, wherein the epitaxial layers are based on a material system different from complementary metal-oxide-semiconductor, CMOS; providing a handle wafer; performing a first dielectric bonding between the epitaxial growth substrate and the handle wafer such that an order of the epitaxial layers for the optical elements is (Continued)

reversed on the handle wafer compared to on the epitaxial growth substrate; removing the epitaxial growth substrate to expose one of the epitaxial layers on the handle wafer; processing the exposed one of the epitaxial layers for providing a common electrode layer for a first contact of each of the optical elements in the optoelectronic device; providing a CMOS integrated circuit, IC, wafer comprising a driver circuit for the optoelectronic device; and performing a second dielectric bonding between the handle wafer and the IC wafer such that an order of the epitaxial layers for the optical elements is reversed on the IC wafer compared to on the handle wafer.

16 Claims, 14 Drawing Sheets

(51) Int. Cl.
*H01L 33/00* (2010.01)
*H01L 33/60* (2010.01)
*H01L 33/62* (2010.01)

(52) U.S. Cl.
CPC .............. *H01L 33/60* (2013.01); *H01L 33/62* (2013.01); *H01L 2933/0016* (2013.01); *H01L 2933/0058* (2013.01); *H01L 2933/0066* (2013.01)

(56) References Cited

U.S. PATENT DOCUMENTS

| | | | |
|---|---|---|---|
| 2014/0184062 A1* | 7/2014 | Kolodin | H05B 45/20 |
| | | | 315/32 |
| 2017/0069609 A1 | 3/2017 | Zhang | |
| 2017/0069611 A1 | 3/2017 | Zhang | |
| 2018/0261641 A1 | 9/2018 | Maruyama | |
| 2019/0013337 A1* | 1/2019 | Nayak | H01L 27/156 |

FOREIGN PATENT DOCUMENTS

| | | |
|---|---|---|
| JP | 2014192411 A | 10/2014 |
| WO | 2018053378 A1 | 3/2018 |
| WO | 2017061273 A1 | 7/2018 |
| WO | 2018132070 A1 | 7/2018 |

OTHER PUBLICATIONS

Wang, Y., et al. High-performance AlGaInP light-emitting diodes integrated on silicon through a superior quality germanium-on-insulator. Photonics Research. vol. 6, No. 4, Apr. 2018. pp. 290-295.

* cited by examiner

METHOD OF FABRICATING AN INTEGRATED STRUCTURE FOR AN OPTOELECTRONIC DEVICE AND INTEGRATED STRUCTURE FOR AN OPTOELECTRONIC DEVICE

FIELD OF INVENTION

The present invention relates broadly to method of fabricating an integrated structure for an optoelectronic device and integrated structure for an optoelectronic device, in particular to a device architecture for active-matrix micro-LED micro display with CMOS backplane and the wafer-level manufacturing method to realize the same.

BACKGROUND

Any mention and/or discussion of prior art throughout the specification should not be considered, in any way, as an admission that this prior art is well known or forms part of common general knowledge in the field.

Micro-light emitting diode, micro-LED, micro display has attracted extensive interests in application fields like augmented reality, AR, head-up display, HUD, and video projector. Compared with conventional micro-display technologies, e.g. digital light processing, DLP, organic light emitting diode, OLED, liquid-crystal display, LCD, liquid crystal on silicon, LCOS, micro-LED micro display excels in various aspects including high brightness, high contrast, high efficiency, high speed and high compactness. Among the several mainstream fabrication technologies, monolithic hybrid integration that relies on alignment-free wafer bonding process, is particularly interesting for low-cost high-volume production. With the standard semiconductor process and well established high-precision photolithography, it is possible to achieve pixel resolution up to 10000 ppi, which is highly demanded by wearable electronics like AR.

The conventional method to achieve high-density hybrid device integration is based on flip-chip technology. Typically, the compound semiconductor devices are fabricated on their own substrate. Then individual chips are separated and bonded to a silicon-based driver circuit wafer via patterned individual indium bumps. Flip-chip is a chip-level process that requires precise alignment, which makes it a low through-put hence high-cost process. The compound semiconductor growth substrate typically remains after the hybrid integration, and the thermal mismatch between the integrated substrates introduces built-in stress in the hybrid chip, which may cause manufacture yield loss and long-term reliability issue. More importantly, limited by the existing manufacturing equipment capability and the process itself, the size of pixel is typically >20 um, which is too large for the next-generation AR application.

A wafer-level monolithic hybrid integration process to overcome the limitations with the flip-chip technology was proposed recently for demonstration of active-matrix micro-LED micro display with pitch size<20 um [1]. It is based on a one-time wafer-level metal bonding process, which does not require bonding alignment. The un-patterned as-grown LED epi wafer is firstly bonded to a driver circuit wafer (named integrated circuit, IC, wafer) through a continuous metal layer. After removing the epitaxial, epi, substrate, the micro-LED array is patterned and the bonding metal is isolated through standard semiconductor processing. The bottom p-contact of each micro-LED is individually connected to the pixel driver circuit in the IC wafer through the isolated bonding metal pad. The top n-contacts of the micro-LED array are connected to a common cathode. Such vertical structure promises high filling ratio, thus high device density.

However, the presence of the continuous metal layer under the LED epitaxial layers can introduce a series of fabrication issues, e.g. yield loss due to the high-temperature high-pressure metal bonding process, metal contamination during pixel isolation, chemical process compatibility with the bonding material, bonding reliability issues when thinning down the metal for high-density pixel patterning, limited optimization space for bonding quality, ohmic contact and optical reflectance with limited metal choices. More importantly, mass production with existing foundry infrastructure is generally impossible due to the involvement of CMOS-non-compatible metal types in the bonding layer.

Embodiments of the present invention seek to address at least one of the above problems.

SUMMARY

In accordance with a first aspect of the present invention, there is provided an integrated structure for an optoelectronic device, the integrated structure comprising:
  a complementary metal-oxide-semiconductor, CMOS, backplane comprising a driver circuit for the optoelectronic device;
  a plurality of optical elements on the CMOS backplane, wherein the optical elements are based on a material system different from CMOS;
  a bonding dielectric provided between the CMOS backplane and the optical elements for monolithic integration; and
  a continuous common electrode layer in electrical contact with a first contact of each optical element;
  wherein a second contact of each optical element is individually connected to the driver circuit in the CMOS backplane.

In accordance with a second aspect of the present invention, there is provided a method of fabricating an integrated structure for an optoelectronic device, the method comprising the steps of:
  forming a plurality of epitaxial layers for optical elements on an epitaxial growth substrate, wherein the epitaxial layers are based on a material system different from complementary metal-oxide-semiconductor, CMOS;
  providing a handle wafer;
  performing a first dielectric bonding between the epitaxial growth substrate and the handle wafer such that an order of the epitaxial layers for the optical elements is reversed on the handle wafer compared to on the epitaxial growth substrate;
  removing the epitaxial growth substrate to expose one of the epitaxial layers on the handle wafer;
  processing the exposed one of the epitaxial layers for providing a common electrode layer for a first contact of each of the optical elements in the optoelectronic device;
  providing a CMOS integrated circuit, IC, wafer comprising a driver circuit for the optoelectronic device; and
  performing a second dielectric bonding between the handle wafer and the IC wafer such that an order of the epitaxial layers for the optical elements is reversed on the IC wafer compared to on the handle wafer.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

Figure 1:
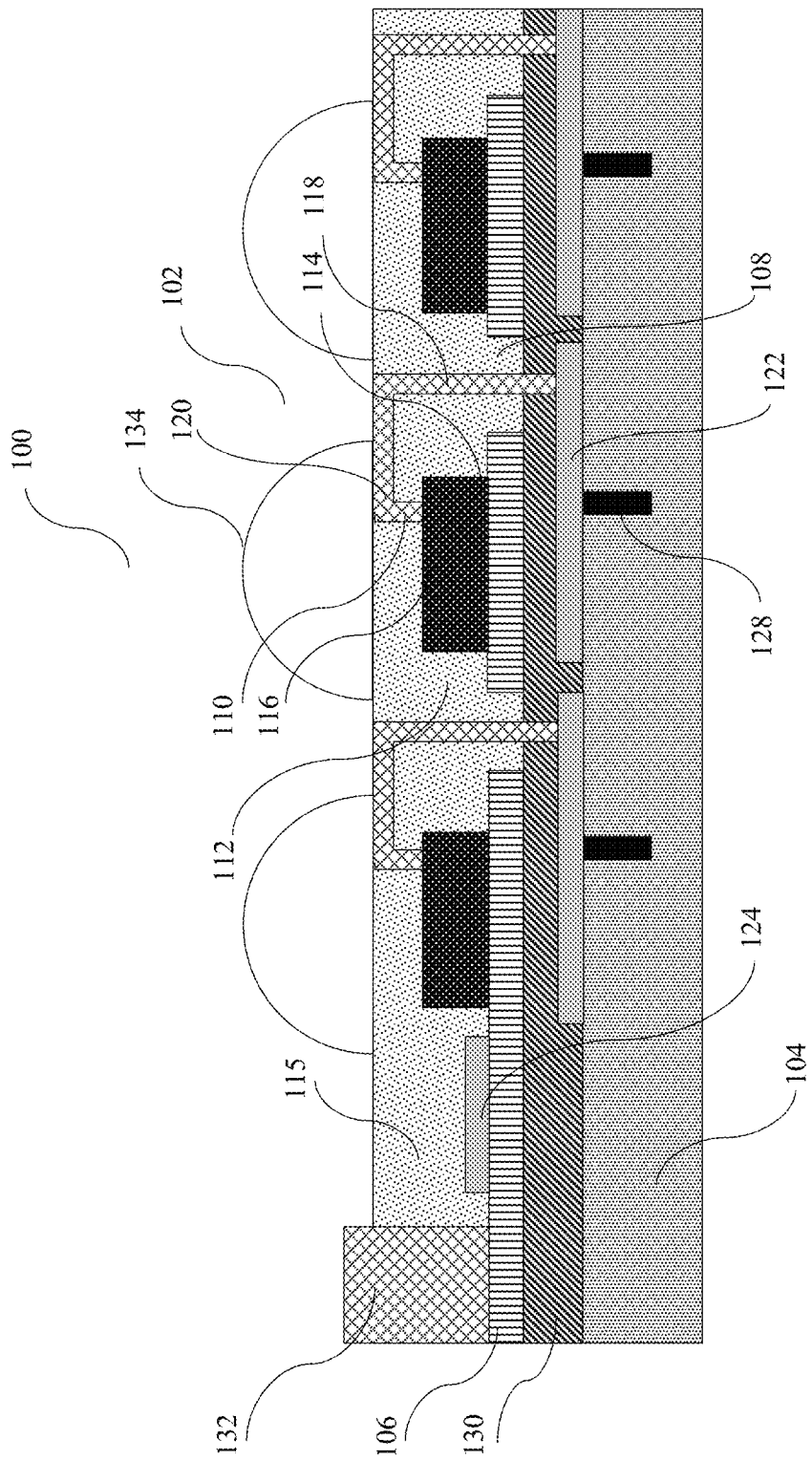
FIG. 1 shows a cross-sectional schematic drawing illustrating an active-matrix micro-LED micro-display architecture with micro-LED array integrated on a CMOS backplane, according to an example embodiment.

Embodiments of the present invention provide a device architecture for active-matrix micro-LED micro display, featuring a micro-LED array integrated with a display driver circuit wafer (integrated circuit, IC, wafer) via a dielectric bonding interface, with the micro-LED p-contact on top and the n-contact at the bottom. The top p-contact of each micro-LED is individually connected with the pixel driver circuit in the IC wafer. The bottom n-type epi of the entire micro-LED array is continuous and connected to a common cathode. A monolithic hybrid integration technique based on alignment-free double-transfer dielectric wafer bonding process is provided according to example embodiments, to realize such device architecture. Compared with the conventional single-transfer metal bonding approach, the method according to example embodiments eliminates the metal contamination and a series of process compatibility issues associated with the bonding metal, thus simplifying the process significantly. The double-transfer technique according to example embodiments also allows the engineering of the micro-LED bottom reflector in both structure and material, which can significantly improve the emission efficiency and directionality of micro-LED. In example embodiments, the n-layer is at the bottom, as the p-layers are generally too thin to be amenable to the micro-structuring process. Also, the technique according to example embodiments can be compatible with existing CMOS foundry processes, which is highly desirable for low-cost high-volume production.

The manufacturing method and device architecture according to example embodiments can achieve comparable device density and meanwhile can preferably overcome all the limitations of the prior art. The process according to example embodiments is based on a double-transfer dielectric wafer bonding process. The continuous epi layer is transferred to a handle wafer first then to the IC wafer through two dielectric wafer bonding steps. The resultant epi-on-IC has the p-type epi at the top and the n-type epi at the bottom according to example embodiments. The micro-LED arrays and the associated electrical connections are subsequently patterned through standard semiconductor processing according to example embodiments. With dielectric bonding, the metal contamination and the series of process compatibility issues associated with the bonding metal in the prior art can be eliminated. The double-transfer technique also allows the engineering of 3 the micro-LED bottom reflector in both structure and material, to improve the emission efficiency and emission directionality. The bottom n-type epi can also be kept continuous to simplify the fabrication and increase the device density according to example embodiments. Furthermore, with a transparent bonding interface according to example embodiments, one can stack R,G,B micro-LEDs on top of each other to achieve full-color display without compromising the display resolution.

The device according to an example embodiments features a micro-LED array integrated on IC with p-side at the top and n-side at the bottom. P-contact of each micro-LED is individually connected with the pixel driver circuit in the IC wafer. N-contact of the whole micro-LED array is continuous and connected to a common cathode. The micro-LEDs and IC wafer are bonded via dielectric intermediate. The fabrication involves a double-transfer wafer bonding technique without the need of bonding alignment. The as-grown LED epitaxial wafer is firstly bonded to a handle wafer though dielectric bonding. After removing the epi substrate, conductive ohmic contact layer, such as ITO or metal or a combination, is deposited over the n-side of the epi. The second dielectric wafer bonding is carried out to transfer the epi on the handle wafer to the IC wafer, leaving the n-side at the bottom and the p-side on the top. Subsequently, the micro-LEDs are isolated at the p- and quantum dot layers, letting the n-doped layer be continuous to form a common cathode. The interconnect between the p-contact and the pixel driver circuit is then established through standard semiconductor processing.

The pixel filling ratio with the device architecture according to example embodiments is comparable with the metal-bonding case, while the fabrication challenges can be significantly reduced. The dielectric bonding advantageously eliminates the metal contamination concern and several process compatibility issues associated with the bonding metal.

It is noted that the structures in the figures in the present application are not drawn in scale. The shape, arrangement, relative position, size of each component may vary depending on the actual application according to various example embodiments.

FIG. 1 shows a cross-sectional schematic diagram illustrating a side view of an active-matrix micro-LED micro-display architecture 100 with micro-LED array 102 integrated on a CMOS backplane 104, according to an example embodiment.

A continuous common electrode layer 106 with discrete opening sites e.g. 108 formed after the bonding onto the CMOS backplane 104 is provided for letting the interconnection between the top contact e.g. 110 and the driver circuit in the CMOS backplane 104 pass through. The common electrode layer 106 can comprise n-doped epitaxial layer, conducting material that forms ohmic contact with the n-type epi, and non-conducting DBR structure for optical reflection. The non-epi conducting material can be Al, Ag, Cu, Au, ITO, or a combination thereof. This common electrode layer 106 can be flat or patterned with micro structure to increase optical extraction of the micro-LED array 102. The common electrode layer 106 preferably has low sheet resistance to assist current spreading. The common electrode layer 106 can be transparent or highly reflective at the emission wavelength.

In each micro-LED e.g. 112 an epitaxial material 114 with light emitting layers (e.g. Quantum well) and doped layers is provided, as is understood by a person skilled in the art.

A transparent dielectric filling 115, e.g. SiO2, spin-on glass, BCB, SU8 etc. is provided according to example embodiments.

The electrical interconnect between the top p-doped epitaxial, epi, e.g. 116 and the pixel driver in the CMOS backplane 104 includes ohmic contact with the p-doped epi e.g. 116 at the top of micro-LED e.g. 112, vertical/horizontal interconnects e.g. 118, 120, passivation (not shown), adhesion layer (not shown) etc. The electrical conducting part can consist of multiple conducting materials, e.g. metal or transparent conducting material. Various configurations are available according to different example embodiments, as will be described below in more detail.

Electrical pads e.g. 122 are provided on top of the driver circuit in the CMOS backplane 104, typically made of Al. When the common electrode layer 106 is transparent, the electrical pads e.g. 122 can serve as a bottom reflector according to an example embodiment.

Metal pad/line/net e.g. 124 can be provided, in direct contact with conducting portions of the common electrode layer 106, to help current spreading over the micro-LED array 102 (or chip). The metal pad/line/net e.g. 124 can be patterned between the micro-LEDs and outside of the micro-LED array 102.

Tungsten plugs e.g. 128 are provided for connecting with individual pixel driver in the CMOS backplane 104.

The continuous transparent bonding dielectric 130, e.g. SiO2, SiN, BCB, etc., is disposed between the electrical pads e.g. 122 on top of the driver circuit in the CMOS backplane 104 and the common electrode layer 106.

A common electrode pad 132 is provided outside of the display region. Micro-lenses e.g. 134 can be provided above the respective micro-LEDs e.g. 112.

Figure 2:
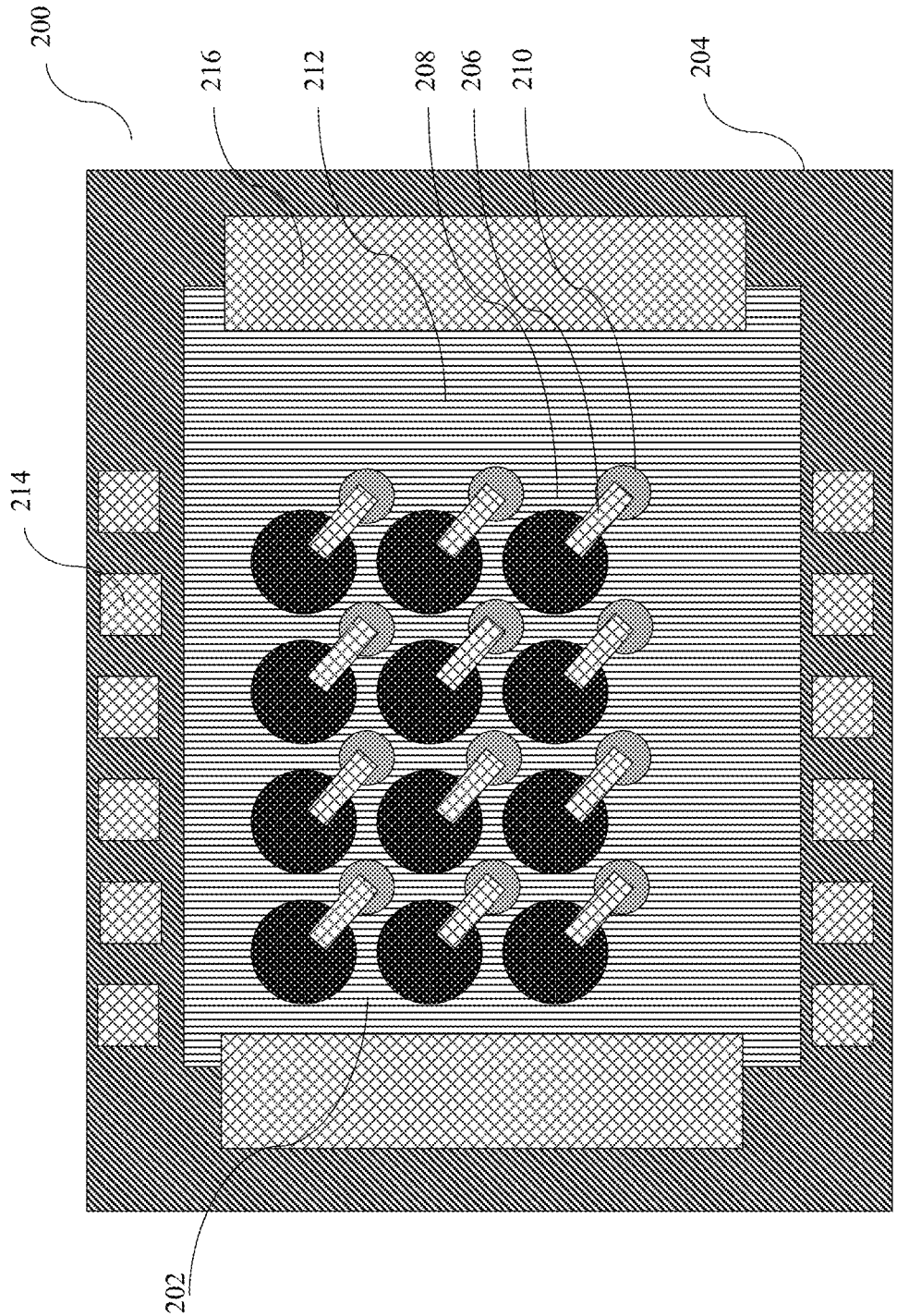
FIG. 2 shows a schematic drawing illustrating a top view of active-matrix micro-LED micro-display architecture with micro-LED array integrated on a CMOS backplane according to an example embodiment.

FIG. 2 shows a schematic diagram illustrating a top view of an active-matrix micro-LED micro-display architecture 200 with micro-LED array 202 integrated on a CMOS backplane 204, according to an example embodiment.

To illustrate the architecture 200 more clearly, the microlens, the metal pad/lines/net on the continuous common electrode layer for current spreading and the transparent dielectric filling described above with reference to FIG. 1 according to an example embodiments are not explicitly shown in FIG. 2.

Electrical interconnects e.g. 206 are provided between the micro-LEDs e.g. 208 top contact and the IC circuit in the CMOS backplane 204. Discrete opening sites e.g. 210 are formed in the common electrode layer 212 for top-down interconnection. Metal pads e.g. 214, 216 for power supply and control signal are provided outside the display area.

Figure 3A:
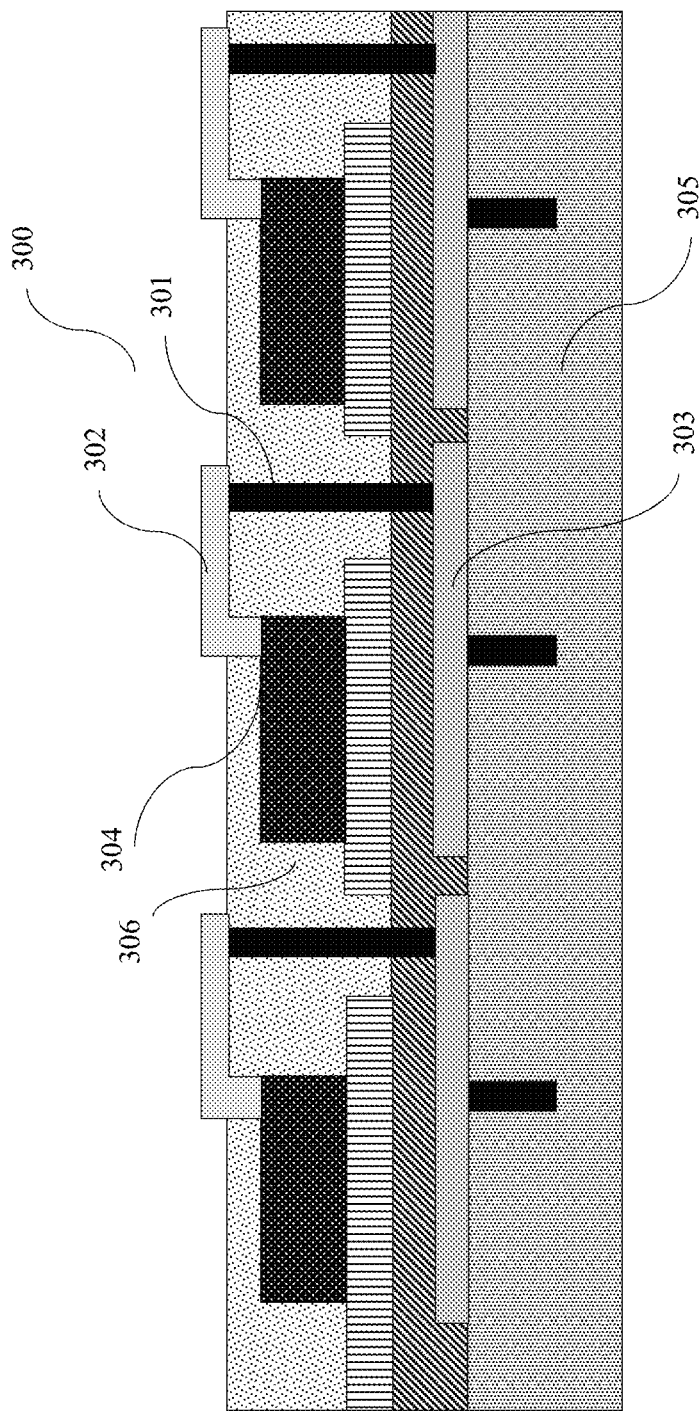
FIG. 3a shows a cross-sectional schematic drawing illustrating a possible configuration for individual p-to-IC connection, according to an example embodiment.

FIG. 3a shows a cross-sectional schematic diagram illustrating a configuration for individual p-to-IC connection in a micro-LED array 300 (or chip) according to an example embodiment. Tungsten plugs e.g. 301 are used to establish the vertical interconnection to the IC top metal pad e.g. 303 on the CMOS backplane 305.

Contacts e.g. 302 comprising metal or transparent conducting oxide (e.g. Al, ITO, tungsten) or a combination thereof form the ohmic contact with the p-doped epi e.g. 304 on top of the micro-LED e.g. 306 and the lateral electrical connection to the tungsten plugs e.g. 301.

Figure 3B:
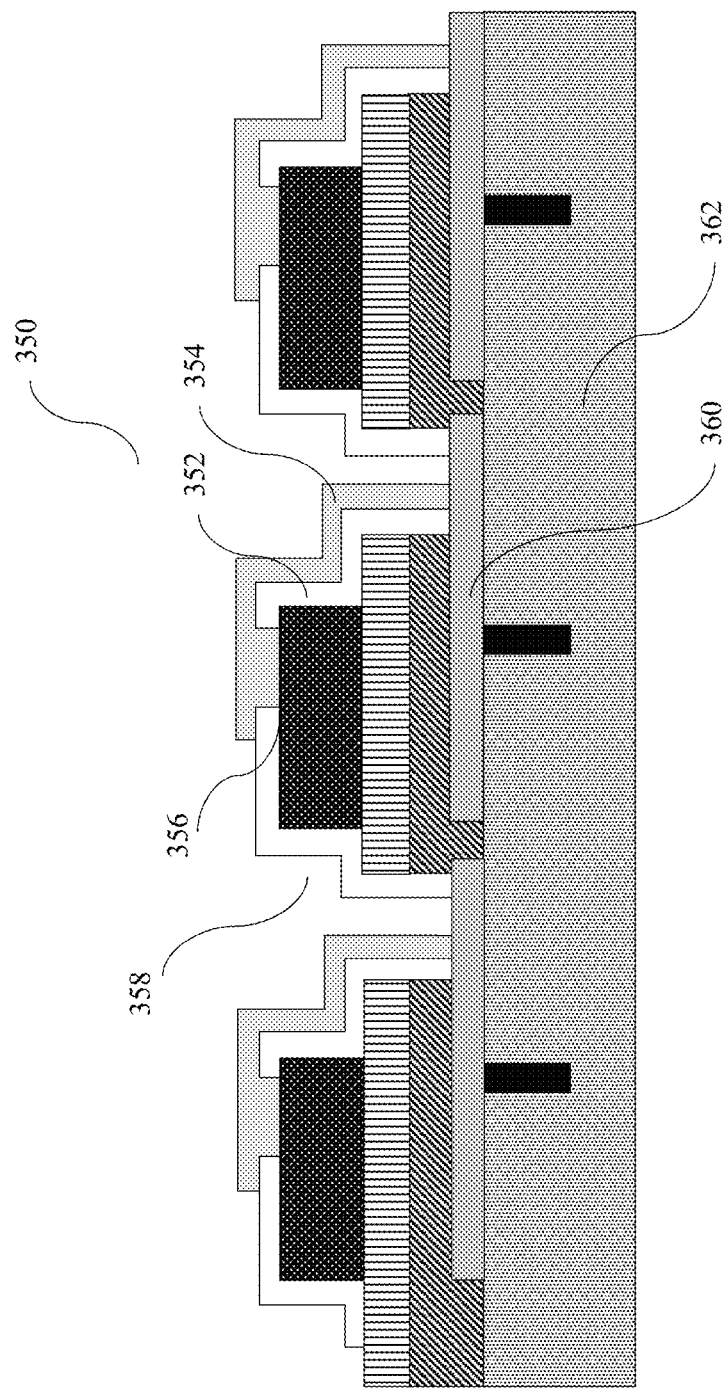
FIG. 3b shows a cross-sectional schematic drawing illustrating a possible configuration for individual p-to-IC connection, according to an example embodiment.

FIG. 3b shows a cross-sectional schematic diagram illustrating a configuration for individual p-to-IC connection in a micro-LED array 350 (or chip) according to an example embodiment, involving sidewall passivation 352 and conductive material e.g. 354 patterning.

The conductive material e.g. 354 can comprise metal or transparent conducting oxide (e.g. Al, ITO) or a combination thereof forms the ohmic contact with the p-doped epi e.g. 356 on top of the micro-LED e.g. 358 and electrical connection with the IC top metal pad e.g. 360 on the CMOS backplane 362. The sidewall passivation e.g. 352 comprises, for example, SiO2, SiN.

Possible structures for the common electrode layer according to example embodiments will now be described, using the configuration as shown in FIG. 3a for illustration.

Figure 4A:
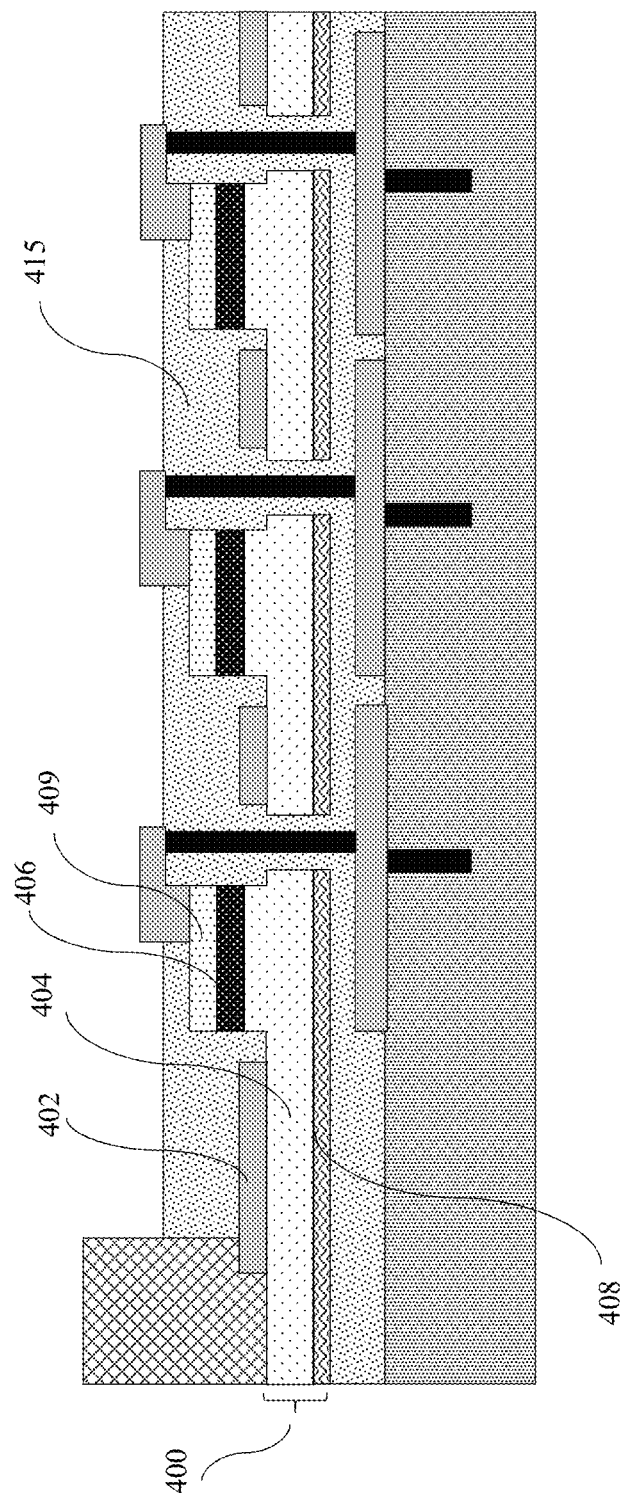
FIG. 4a shows a cross-sectional schematic drawing illustrating use of metal pad/line/net on the continuous n-type epi to improve the current spreading, according to an example embodiment.

FIG. 4a shows a cross-sectional schematic diagram illustrating a side view of the structure of the common electrode layer 400 according to an example embodiment, including the use of metal pad/line/net 402 on the continuous n-type epi 404 to improve the current spreading.

More specifically, the common electrode layer 400 in example embodiments comprises a portion of the n-type epi 404 and a bottom contact and reflector layer 408, which will be described in more detail below. Metal pad/line/net 402 electrically in contact with the common electrode layer 400 is provided to assist current spreading. Ohmic contact between the metal pad/line/net 402 and the continuous n-type epi 404 of the common electrode layer 400 is preferred for high efficiency. A light-emitting layer e.g. 406, for example using quantum well structures, and p-type top epi e.g. 409 for the micro-LEDs are provided, as will be understood by a person skilled in the art.

Figure 4B:
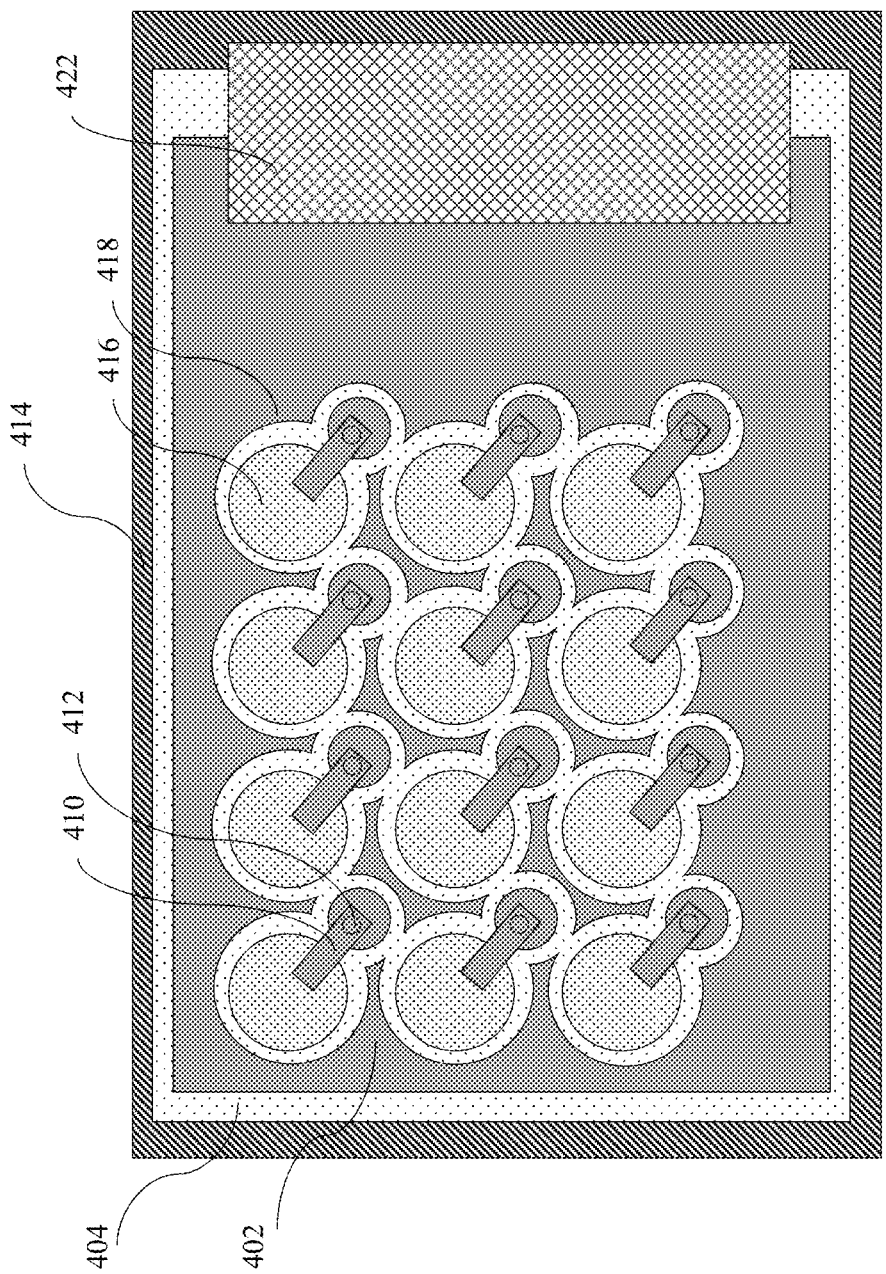
FIG. 4b shows a schematic drawing illustrating a top down view of use of metal pad/line/net on the continuous n-type epi to improve the current spreading, according to an example embodiment.

FIG. 4b shows schematic diagram illustrating a top down to the example embodiment of FIG. 4a, including the use of metal pad/line/net 402 on the continuous n-type epi 404 which forms part of the common electrode layer 400 (FIG. 4*a*) to improve the current spreading.

It is noted again that the schematic drawing is for illustration purpose. The shape, arrangement, relative position, size of each component may vary in different example embodiments. Top metal pads e.g. 410 and tungsten plugs e.g. 412 under the top metal pads e.g. 410 are used for the interconnection to the driver circuit in the CMOS backplane 414. Also visible through the transparent dielectric filling 415 (FIG. 4*a*) are the top p-epi e.g. 416 of the micro-LEDs e.g. 418. Common electrode metal pad 422 outside the display area is provided in this example embodiment.

Figure 5:
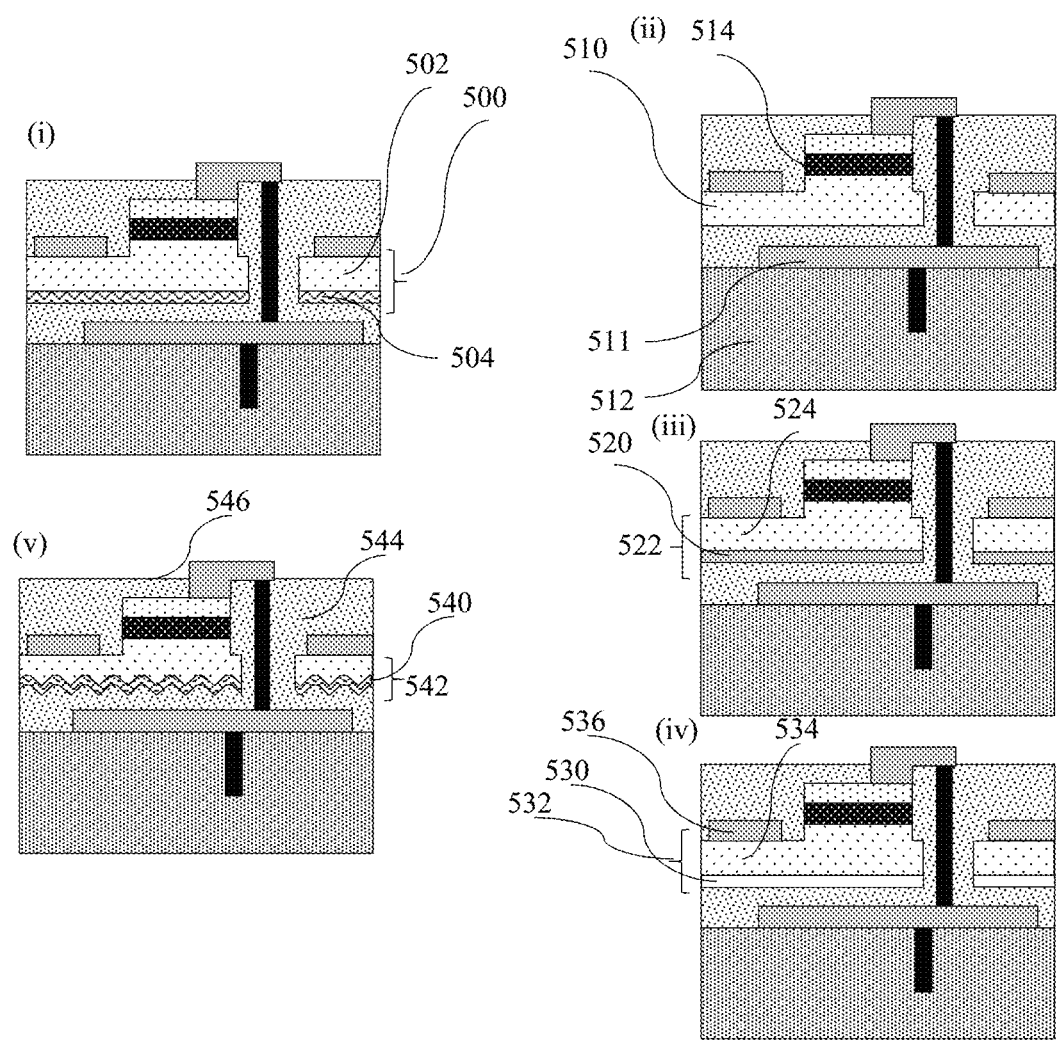
FIG. 5 shows cross-sectional schematic drawings illustrating structural and material variation for the bottom contact/reflector of micro-LED, according to example embodiments.

FIG. 5 shows cross-sectional schematic diagrams illustrating a structural and material variation for the bottom contact/reflector of the common electrode layer for the micro-LED according to example embodiments, using the configuration as shown in FIG. 3*a* for illustration.

Specifically, FIG. 5(*i*) shows the general structure and composition for the bottom contact/reflector of the common electrode layer according to an example embodiment, with the common electrode layer 500 comprising the n-type epi 502 and a bottom contact/reflector layer 504.

Composition variations for the bottom contact/reflector layer 504 of the common electrode layer 500 according to example embodiments include:

FIG. 5(*ii*): No bottom contact or reflector is provided as part of the common electrode layer 510. Instead, the electrical pad 511, e.g. metal, from the IC in the backplane 512 functions as the bottom reflector. The separation between the epi 510 and the electrical pad 511 can be optimized to maximize the optical reflection and thus emission efficiency.

FIG. 5(*iii*): A conductive bottom contact and reflector 520 is provided as part of the common electrode 522. The conductive bottom contact and reflector 520 can comprise metal or metal and transparent conducting oxide. The conductive bottom contact and reflector 520 preferably forms ohmic contact with the n-type epi 524 of the common electrode 522 to help the current spreading.

FIG. 5(*iv*): A non-conductive reflector 530, e.g. DBR or DBR and metal, is provided as part of the common electrode layer 532 to achieve high reflectivity. No bottom contact is provided.

The non-conductive reflector 530 does not form electrical connection with the n-type epi 534. The current spreading is achieved through n-type epi 534 and the metal pad/line/nets e.g. 536 on top of the n-type epi 534 in an example embodiment.

Structural variations for the bottom contact/reflector of the common electrode layer according to example embodiments include:

FIG. 5(*v*): A micro-structured layer 540, which can be randomly arranged in an example embodiment, as part of the common electrode layer 542 serves as a rough interface to enhance the optical extraction of the micro-LED 544. The micro structure in the micro-structured layer 540 can also be periodic to form photonic crystal in an example embodiment, which can be used to reduce the lateral light propagation within the common electrode layer 542 or to enhance the light propagation/emission in the direction perpendicular to the display surface 546. The structural features of the micro-structure are preferably smaller than the micro-LED e.g. 544.

Optical isolation trench in the common electrode layer for the micro-LED according to example embodiments, using the configuration as shown in FIG. 3*a* for illustration.

As will be appreciated by a person skilled in the art, optical waveguide effect in the continuous n-doped epi could cause optical cross talk between adjacent pixels/micro-LEDs. There are several ways to optically isolate each pixel/micro-LED without interrupting the electrical continuity of the common electrode layer according to example embodiments.

Figure 6A:
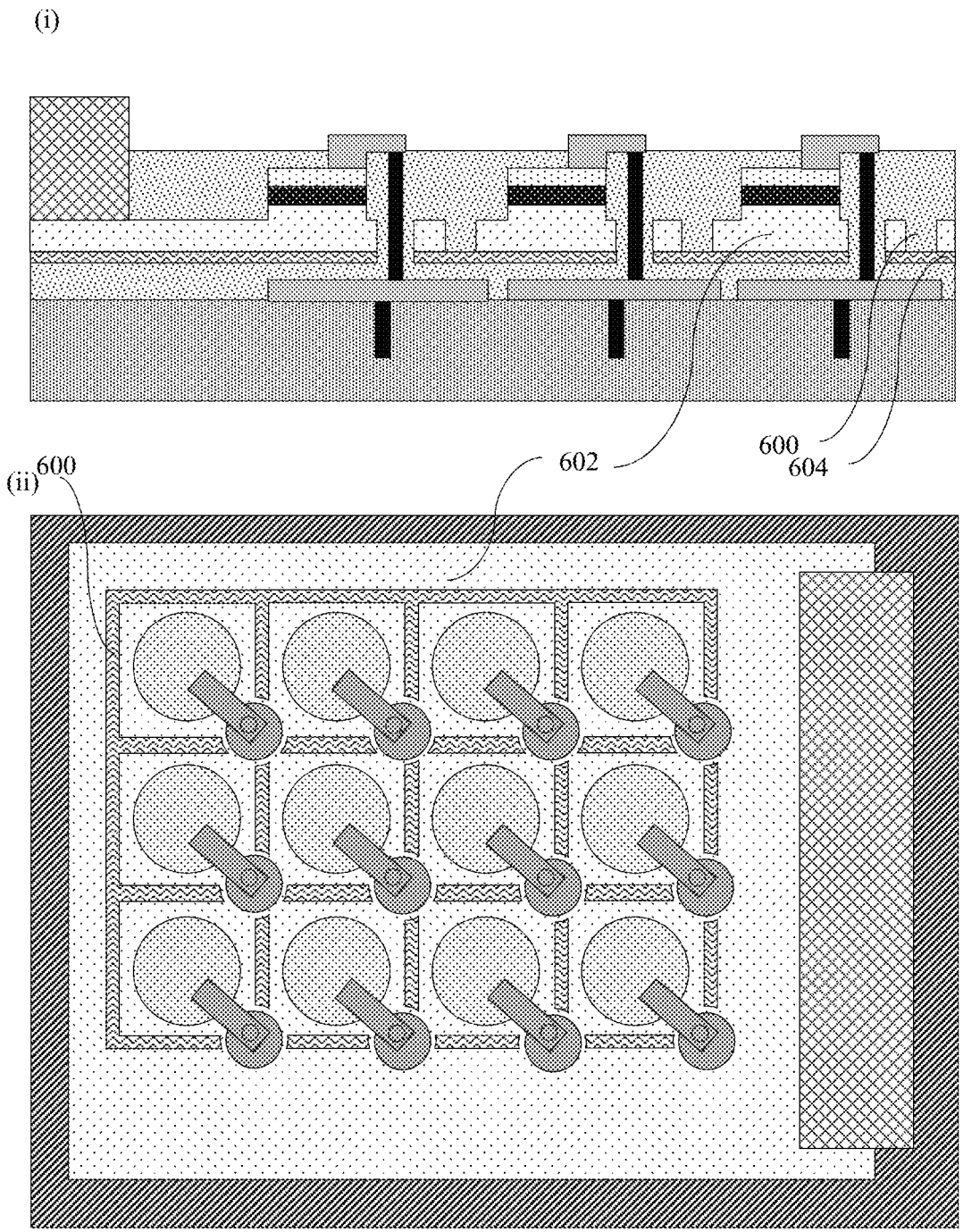
FIG. 6a shows schematic drawings illustrating etched optical isolation trench to prevent the waveguiding effect within the n-type epi that may cause inter-pixel optical crosstalk, according to an example embodiment.

FIG. 6*a* shows schematic diagrams illustrating an etched optical isolation trench(es) e.g. 600 to prevent the waveguiding effect within the n-type epi 602 that may cause inter-pixel optical crosstalk, according to an example embodiment. FIG. 6*a*(*i*) shows a cross-section side view, and FIG. 6*a*(*ii*) shows a top down view. The trench 600 is only etched through the n-type epi 602, leaving the conducting layer 604 at the bottom continuous. This configuration is hence preferably used with conductive bottom contact/reflector layer as in FIG. 5(*iii*).

It is noted that top metal on n-epi 602 can also be implemented in such an example embodiment for current spreading, but is not explicitly shown in FIG. 6*a*. The shape and the arrangement of isolation trench 600 can vary in different example embodiments.

Figure 6B:
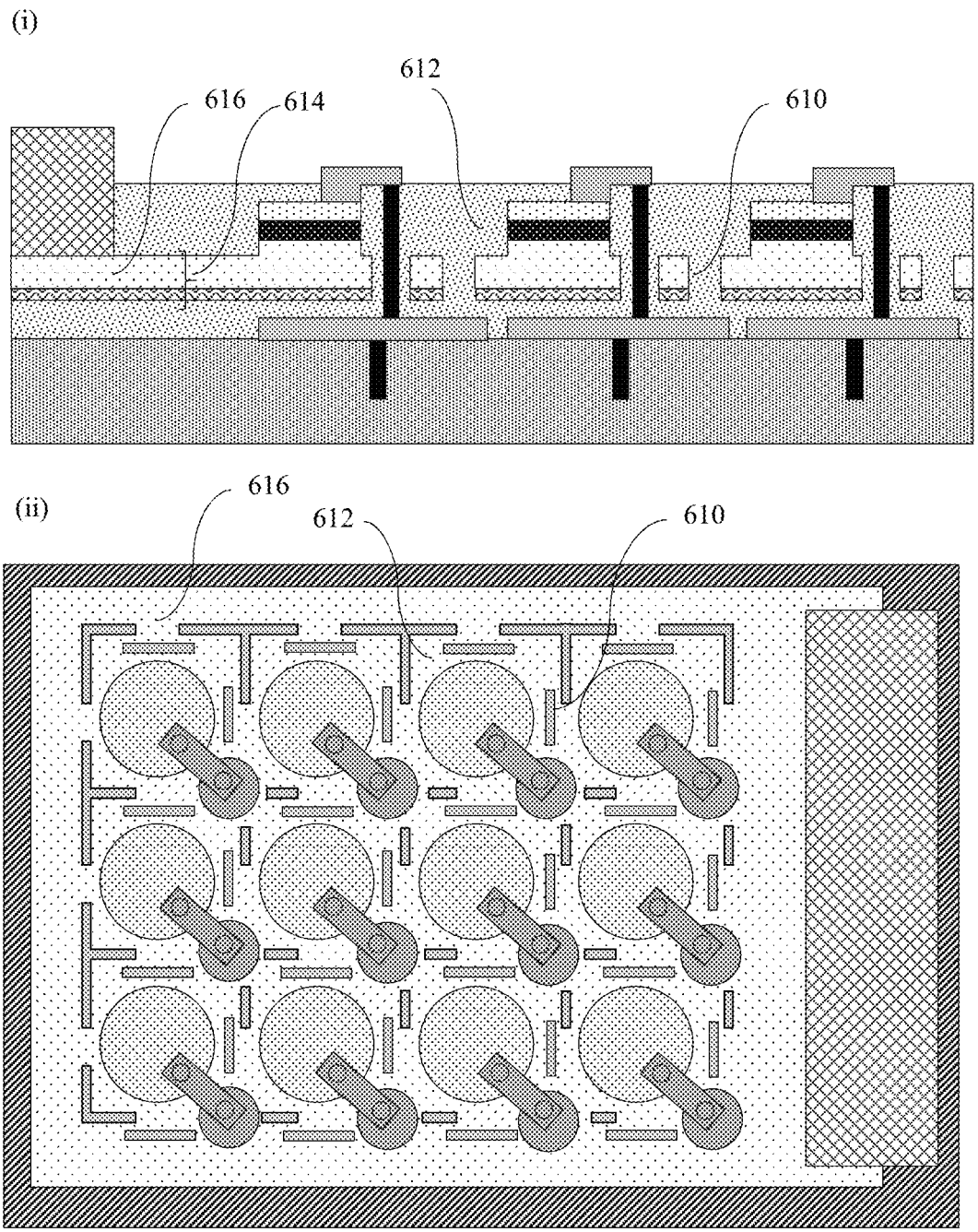
FIG. 6b shows schematic drawings illustrating creating micro channel around individual LED to optically isolate the pixel, according to an example embodiment.

FIG. 6*b* shows schematic diagrams illustrating creating micro channel(s) e.g. 610 around individual micro-LEDs e.g. 612 to optically isolate the pixel, specifically a cross-section side view in FIG. 6*b*(*i*) and a top down view in FIG. 6*b*(*ii*). The channel 610 is etched through the entire common electrode layer 614, but interlaced so as to not break the electrical continuity. Meanwhile, redundant tungsten plugs can be introduced through the micro-channel to further reduce the optical cross talk between pixel LEDs.

Top metal on n-epi 616 can also be implemented in such an example embodiment for current spreading, but is not explicitly shown in FIG. 6*b*. Again, the shape and the arrangement of isolation trench 610 can vary in different example embodiments.

Fabrication Process According to Example Embodiments

Figure 7A:
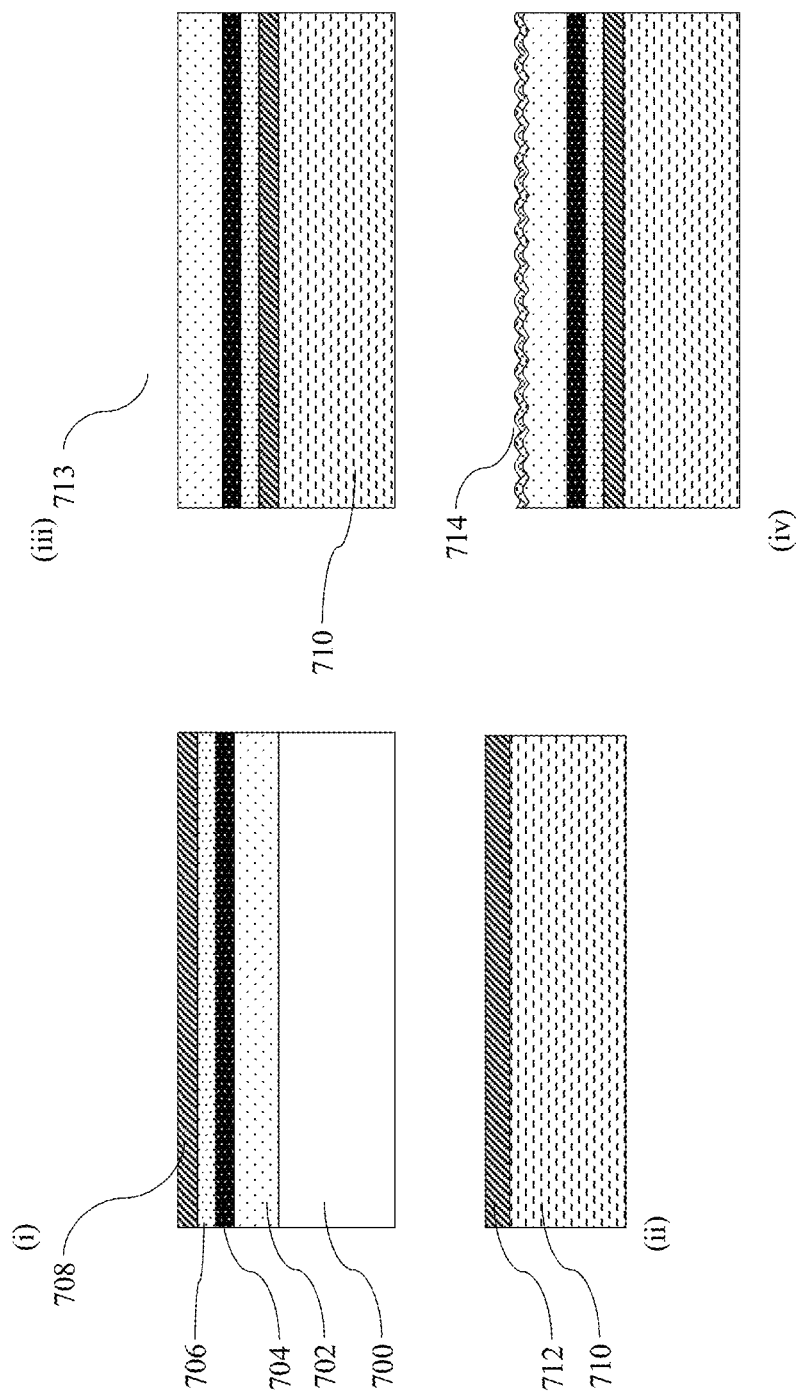
FIG. 7a shows cross-sectional schematic drawings illustrating steps of a double-transfer process that transfers the epi to the handle wafer followed by micro-structuring and contact/reflector formation over the n-type epi, according to an example embodiment.

FIG. 7*a* shows cross-sectional schematic diagrams illustrating steps involved in a double-transfer process that transfers the epi to the handle wafer followed by microstructuring and contact/reflector formation over the n-type epi, according to an example embodiment.

As shown in FIG. 7*a*(*i*), an epitaxial substrate 700 suitable for formation of the n-type epi 702, the light emitting quantum well epi 704 and the p-type epi 706 is used. A planarized dielectric 708 is provided on top of the p-type epi 706. Separately, a handle wafer 710 is provided, also covered with a planarized dielectric 712, as shown in FIG. 7*a*(*ii*).

Dielectric bonding using the planarized dielectrics 708, 712 is then performed between the epitaxial substrate 700 (face down) and the handle wafer 710 (face up) followed by removal of the epitaxial substrate 700, resulting in the structure 713 as shown in FIG. 7*a*(*iii*).

As shown in FIG. 7*a*(*iv*), patterning a micro-structure using chemical or dry etching, and depositing ohmic contact, current spreading layer, and optical reflector on top in an example embodiment, indicated in FIG. 7*a*(*iv*) as layer 714. Layer 714 can comprise multiple materials, including one or more of a group consisting of transparent conducting oxide, metal, DBR etc.

Figure 7B:
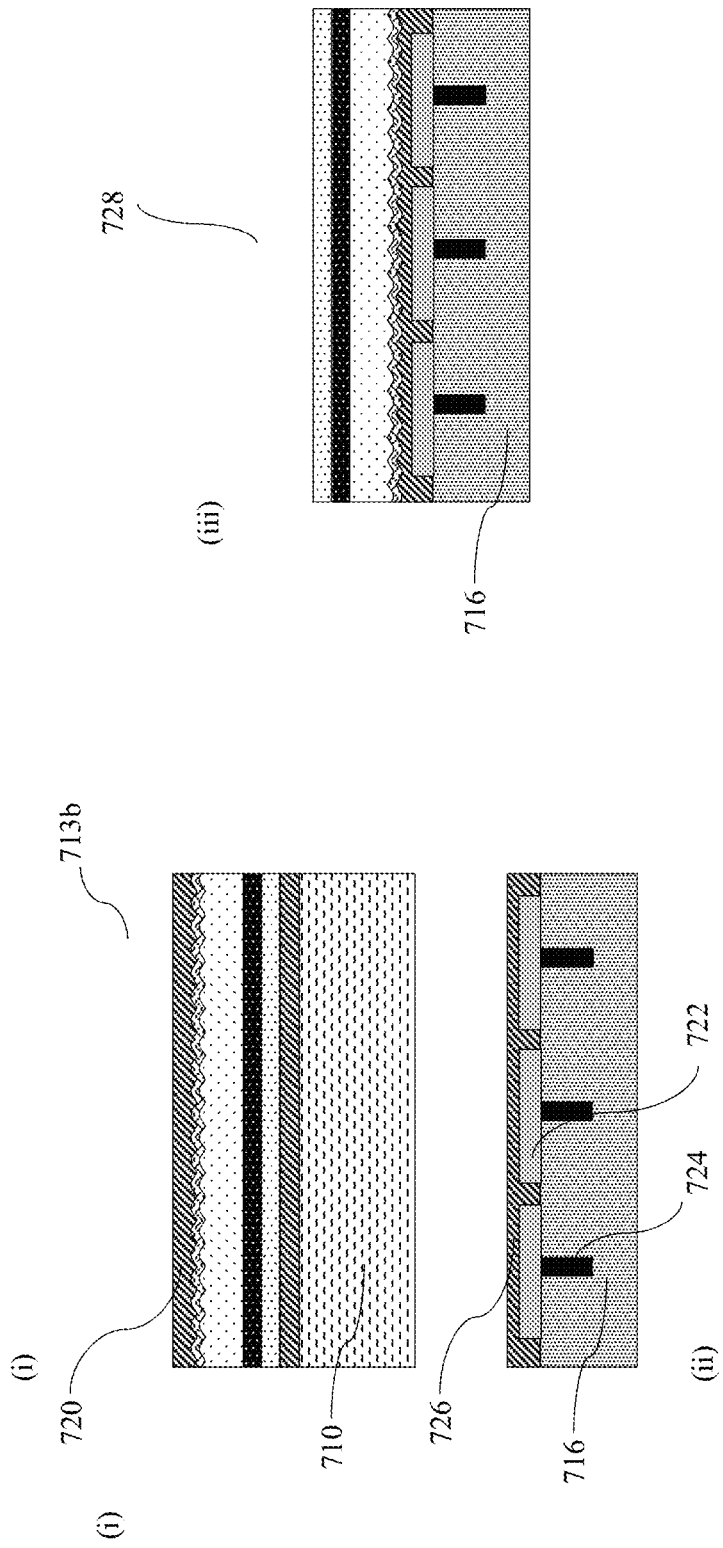
FIG. 7b shows cross-sectional schematic drawings illustrating further steps of the double-transfer process that transfers the epi from the handle wafer to the IC wafer, according to an example embodiment.

FIG. 7*b* shows cross-sectional schematic diagrams illustrating further steps involved in the double-transfer process according to an example embodiments, specifically the processing steps to transfer the epi from the handle wafer 710 to the IC wafer 716, here providing a CMOS backplane for a micro-LED array.

A planarized dielectric 720 is provided on the structure 713*b*, as shown in FIG. 7*b*(*i*). Separately, the IC wafer 716 with electrical pads e.g. 722 and display driver circuit (only vertical interconnects e.g. 724 shown) and a planarized dielectric 726, as shown in FIG. 7*b*(*ii*), is provided.

Dielectric bonding using the planarized dielectrics 720, 726 is then performed between the handle wafer 710 (face down) and the IC wafer 716 (face up) followed by removal of the handle wafer 710, resulting in the structure 728 as shown in FIG. 7*b*(*iii*).

Figure 8:
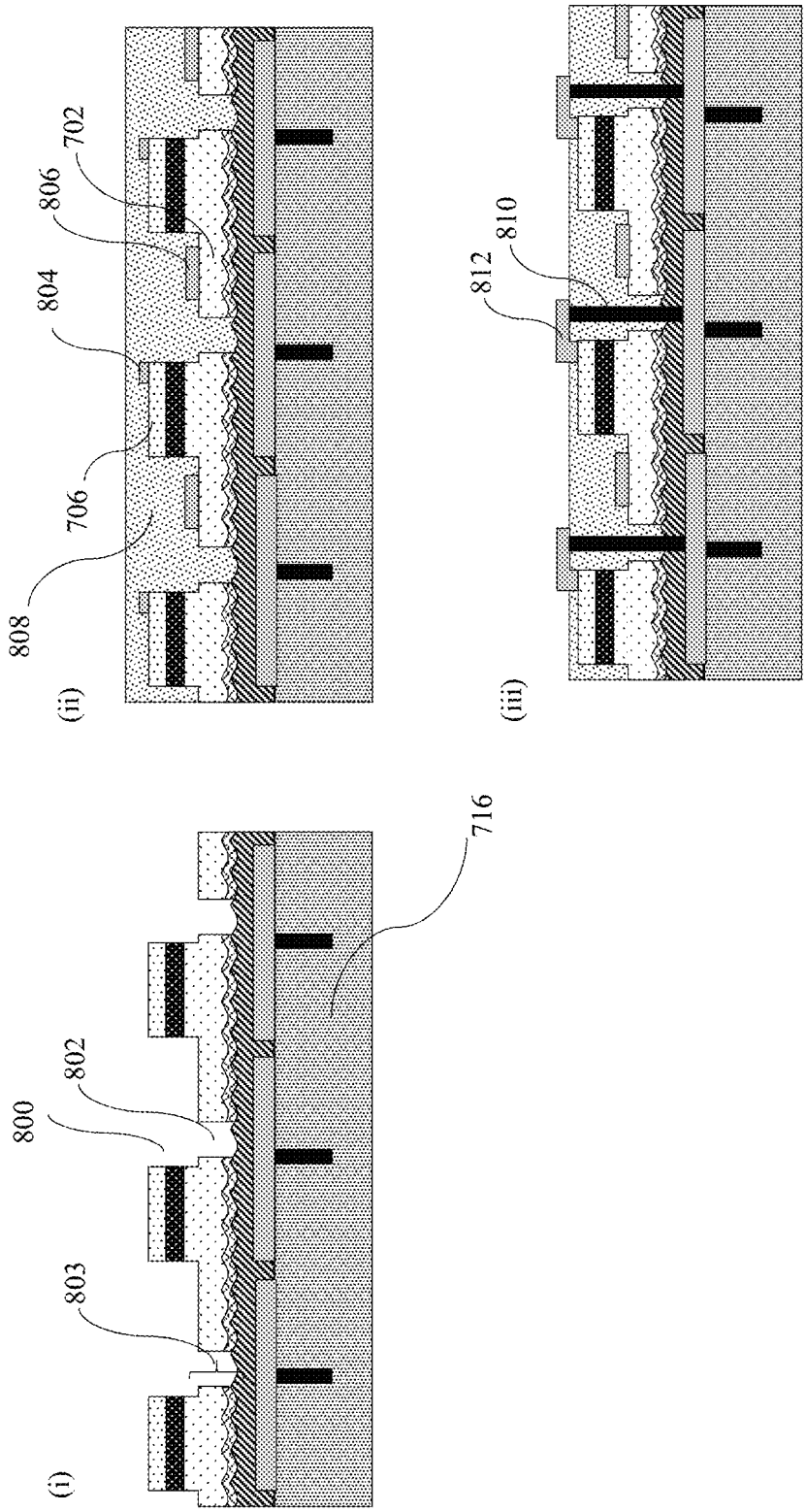
FIG. 8 shows cross-sectional schematic drawings illustrating steps of a process to pattern micro-LEDs and form electrical connection between the top p-contact to the driver pixel circuit in the IC wafer, according to an example embodiment.

FIG. 8 shows cross-sectional schematic diagrams illustrating further steps involved in the process to fabricate the configuration as shown in FIG. 3*a*, according to an example embodiment, specifically patterning micro-LEDs e.g. 800 and forming electrical connection between the top p-contact to the driver pixel circuit in the IC wafer 716.

Dry etching is used to pattern the micro-LEDs e.g. 800, the p-contact opening 802 through the common electrode layer 803, as shown in FIG. 8(*i*). Optical isolation trenches can also be formed using dry etching, but isolation trenches are not explicitly shown in FIG. 8(*i*).

Next, contact pads e.g. 804 are formed on p-type epi 706 and current spreading pads e.g. 806 are formed on n-type epi 702. SiO2 as a transparent dielectric filling 808 is deposited and planarize with chemical-mechanical polishing, CMP, as shown in FIG. 8(*ii*). It is noted that ohmic contact pads e.g. 804 can alternatively be formed before the double transfer process (compare FIG. 7*a*(*i*)).

Tungsten plugs e.g. 810 and other conductive patterns e.g. 812 to establish the horizontal and vertical interconnection are then formed, as shown in FIG. 8(*iii*).

Figure 9:
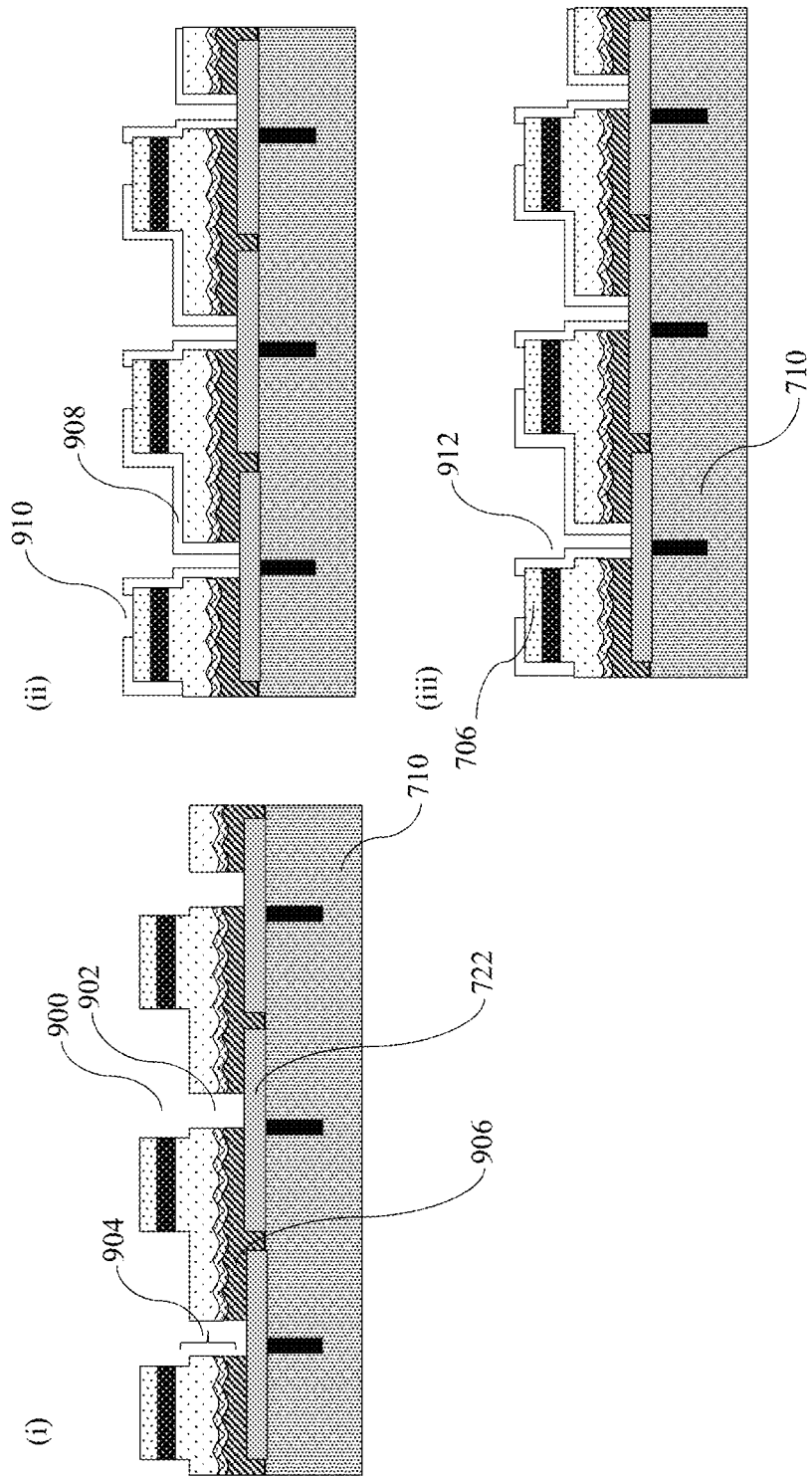
FIG. 9 shows cross-sectional schematic drawings illustrating steps of a process to pattern micro-LEDs and form electrical connection between the top p-contact to the driver pixel circuit in the IC wafer, according to an example embodiment.

FIG. 9 shows cross-sectional schematic diagrams illustrating further steps after the double transfer process (compare FIGS. 7*a* and 7*b*) involved in the process to fabricate configuration as shown in FIG. 3*b*, according to an example embodiment, specifically patterning micro-LEDs e.g. 900 and forming electrical connection between the top p-contact to the driver pixel circuit in the IC wafer 710.

Dry etching is used to pattern the micro-LEDs e.g. 900, the p-contact openings e.g. 902 through the common electrode layer 904 and the bonding dielectric intermediate 906, to expose the IC electrode pads e.g. 722.

Next, passivation layer 908 is deposited followed by contact window e.g. 910 opening. A conductive layer 912 is patterned to establish electrical connection between the p-type epi 706 and the driver circuit in the IC wafer 710.

In one embodiment, an integrated structure for an optoelectronic device is provided, the integrated structure comprising: a complementary metal-oxide-semiconductor, CMOS, backplane comprising a driver circuit for the optoelectronic device; a plurality of optical elements on the CMOS backplane, wherein the optical elements are based on a material system different from CMOS; a bonding dielectric provided between the CMOS backplane and the optical elements for monolithic integration; and a continuous common electrode layer in electrical contact with a first contact of each optical element; wherein a second contact of each optical element is individually connected to the driver circuit in the CMOS backplane.

The bonding dielectric may be transparent.

The common electrode layer may also function as a reflector disposed below the optical elements. The reflector may comprise a micro-structure such as a distributed Bragg reflector, DBR, and or a photonic crystal structure.

At least a portion of an electrode pad on the CMOS backplane may function as a reflector.

The first contacts may comprise bottom contacts of the optical elements, and the second contacts comprise top contacts of the optical elements.

The integrated structure may comprise optical isolation trenches patterned between optical elements and extending at least partially through the common electrode layer to achieve optical isolation between the optical elements without breaking the electrical continuity of the common electrode layer.

The integrated structure may comprise metal pads, lines or net patterned on the common electrode layer with direct electrical contact to enhance current spreading.

The integrated structure may further comprise electrical interconnections including one or more of a group consisting of chemical mechanical planarization based contact, tungsten plug, and metal pad.

The integrated structure may further comprise a micro-lens for each optical element to assist light collimation.

Figure 10:
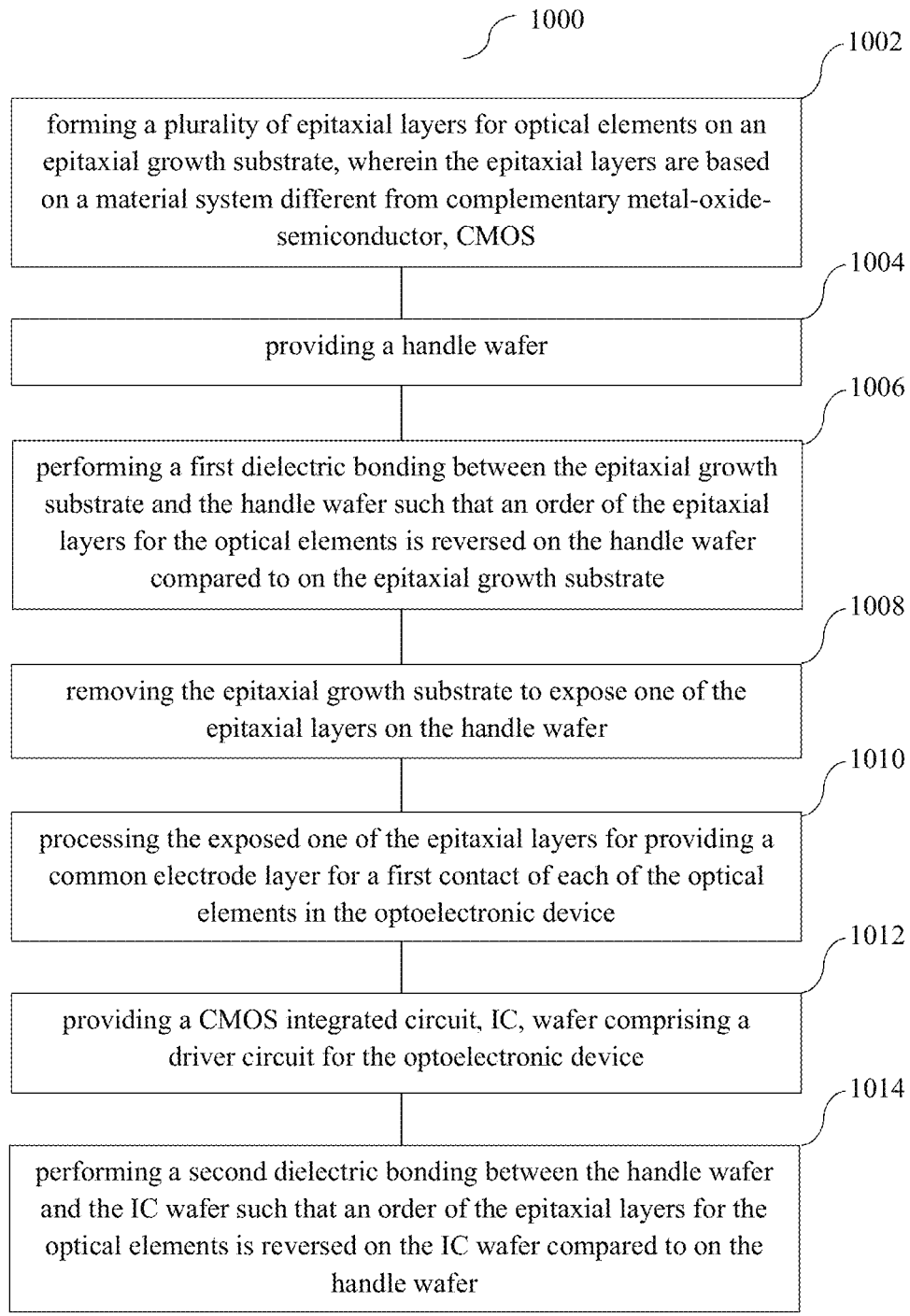
FIG. 10 shows a flow chart illustrating a method of fabricating an integrated structure for an optoelectronic device, according to an example embodiment.

FIG. 10 shows a flow chart 1000 illustrating a method of fabricating an integrated structure for an optoelectronic device, according to one embodiment. At step 1102, a plurality of epitaxial layers for optical elements are formed on an epitaxial growth substrate, wherein the epitaxial layers are based on a material system different from complementary metal-oxide-semiconductor, CMOS. At step 1004, a handle wafer is provided. At step 1006 a first dielectric bonding is performed between the epitaxial growth substrate and the handle wafer such that an order of the epitaxial layers for the optical elements is reversed on the handle wafer compared to on the epitaxial growth substrate. At step 1008, the epitaxial growth substrate is removed to expose one of the epitaxial layers on the handle wafer. At step 1010, the exposed one of the epitaxial layers is processed for providing a common electrode layer for a first contact of each of the optical elements in the optoelectronic device. At step 1012, a CMOS integrated circuit, IC, wafer comprising a driver circuit for the optoelectronic device is provided. At step 1014, a second dielectric bonding is performed between the handle wafer and the IC wafer such that an order of the epitaxial layers for the optical elements is reversed on the IC wafer compared to on the handle wafer.

The method may further comprise patterning the epitaxial layers on the IC wafer for forming the optical elements and patterning the epitaxial layers and the common electrode layer on the IC wafer for forming contact openings. The method may further comprise pattering the epitaxial layers on the IC wafer to form optical isolation trenches. The method may further comprise forming vertical interconnections between a second contact of each optical elements and the driver circuit in the IC wafer.

The method may further comprise patterning the epitaxial layers on the IC wafer for forming the optical elements and patterning the epitaxial layers, the common electrode layer, and a dielectric bonding layer between the optical elements and the IC wafer for forming contact openings. The method may further comprise forming a passivation layer with contact window openings on the epitaxial layers and patterning a conductive layer on the passivation layer for forming vertical interconnections between a second contact of each optical element and the driver circuit in the IC wafer.

The method may further comprise microstructuring a reflector on the common electrode layer, such as a distributed Bragg reflector, DBR, and or a photonic crystal structure.

Industrial Applications of Example Embodiments

Active-matrix micro-LED micro display according to example embodiments can be applied in Augmented Reality (AR)/Mixed Reality(MR) and Heads-up display (HUD), and can also be used in video projector, 3D printing, mask-less lithography applications.

The above description of illustrated embodiments of the systems and methods is not intended to be exhaustive or to limit the systems and methods to the precise forms disclosed. While specific embodiments of, and examples for, the systems components and methods are described herein for illustrative purposes, various equivalent modifications are possible within the scope of the systems, components and methods, as those skilled in the relevant art will recognize. The teachings of the systems and methods provided herein can be applied to other processing systems and methods, not only for the systems and methods described above.

For example, the proposed device architecture and fabrication approach can be implemented to any other semiconductor apparatus that requires hybrid integration of optoelectronic device on CMOS wafer with a plurality of driver circuits arranged in a dense manner, according to different example embodiments. In addition to light-emitting device(s), the proposed technique can also be implemented to light detection system such as focal plane array, according to different example embodiments.

The elements and acts of the various embodiments described above can be combined to provide further embodiments. These and other changes can be made to the systems and methods in light of the above detailed description.

In general, in the following claims, the terms used should not be construed to limit the systems and methods to the specific embodiments disclosed in the specification and the claims, but should be construed to include all processing systems that operate under the claims. Accordingly, the systems and methods are not limited by the disclosure, but instead the scope of the systems and methods is to be determined entirely by the claims.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

REFERENCE

[1] Zhang et al. "Semiconductor apparatus and method of manufacturing the same", US Pat. No. US 2017/0069609 (2017)

The invention claimed is:
1. An integrated structure for an optoelectronic device, the integrated structure comprising:
a complementary metal-oxide-semiconductor, CMOS, backplane comprising a driver circuit for the optoelectronic device;
a plurality of optical elements on the CMOS backplane, wherein the optical elements are based on a material system different from CMOS;
a bonding dielectric provided between the CMOS backplane and the optical elements for monolithic integration; and
a continuous common electrode layer in electrical contact with a first contact of each optical element;
wherein a second contact of each optical element is individually connected to the driver circuit in the CMOS backplane;
wherein the common electrode layer comprises an n-type epitaxial layer of the optical elements; and
wherein the n-type epitaxial layer is patterned with a micro-structure for providing a reflector disposed below the optical elements.

2. The integrated structure of claim 1, wherein the bonding dielectric is transparent.

3. The integrated structure of claim 1, wherein the reflector comprises a micro-structure such as a distributed Bragg reflector, DBR, and or a photonic crystal structure.

4. The integrated structure of claim 1, wherein at least a portion of an electrode pad on the CMOS backplane functions as a reflector.

5. The integrated structure of claim 1, wherein the first contacts comprise bottom contacts of the optical elements, and the second contacts comprise top contacts of the optical elements.

6. The integrated structure of claim 1, comprising optical isolation trenches patterned between optical elements and extending at least partially through the common electrode layer to achieve optical isolation between the optical elements without breaking the electrical continuity of the common electrode layer.

7. The integrated structure of claim 1, comprising metal pads, lines or net patterned on the common electrode layer with direct electrical contact to enhance current spreading.

8. The integrated structure of claim 1, further comprising electrical interconnections including one or more of a group consisting of chemical mechanical planarization based contact, tungsten plug, and metal pad.

9. The integrated structure of claim 1, further comprising a micro-lens for each optical element to assist light collimation.

10. A method of fabricating the integrated structure for an optoelectronic device of claim 1, the method comprising the steps of:
forming the plurality of epitaxial layers for optical elements on the epitaxial growth substrate, wherein the epitaxial layers are based on the material system different from complementary metal-oxide-semiconductor, CMOS;
providing the handle wafer;
performing the first dielectric bonding between the epitaxial growth substrate and the handle wafer such that the order of the epitaxial layers for the optical elements is reversed on the handle wafer compared to on the epitaxial growth substrate;
removing the epitaxial growth substrate to expose the n-type epitaxial layer of the epitaxial layers on the handle wafer;
processing the exposed n-type epitaxial layer for providing the common electrode layer for the first contact of each of the optical elements in the optoelectronic device;

providing the CMOS integrated circuit, IC, wafer comprising the driver circuit for the optoelectronic device; and performing the second dielectric bonding between the handle wafer and the IC wafer such that an order of the epitaxial layers for the optical elements is reversed on the IC wafer compared to on the handle wafer;

wherein processing the exposed n-type epitaxial layer comprises pattering the exposed n-type epitaxial layer with the micro-structure for providing the reflector disposed below the optical elements.

11. The method of claim 10, further comprising patterning the epitaxial layers on the IC wafer for forming the optical elements and patterning the epitaxial layers and the common electrode layer on the IC wafer for forming contact openings.

12. The method of claim 11, further comprising pattering the epitaxial layers on the IC wafer to form optical isolation trenches.

13. The method of claim 10, further comprising forming vertical interconnections between a second contact of each optical elements and the driver circuit in the IC wafer.

14. The method of claim 10, further comprising patterning the epitaxial layers on the IC wafer for forming the optical elements and patterning the epitaxial layers, the common electrode layer, and a dielectric bonding layer between the optical elements and the IC wafer for forming contact openings.

15. The method of claim 14, further comprising forming a passivation layer with contact window openings on the epitaxial layers and patterning a conductive layer on the passivation layer for forming vertical interconnections between a second contact of each optical element and the driver circuit in the IC wafer.

16. The method of claim 10, further comprising micro-structuring the reflector such as a distributed Bragg reflector, DBR, and or a photonic crystal structure.

* * * * *